June 9, 1959 M. SANDERS 2,890,417

FREQUENCY MODULATION SYSTEM

Filed May 27, 1957

INVENTOR.
MILTON SANDERS

BY

W. E. Thibodeau, T. J. Lynch, J. E. McGee and J. P. Edgerton

United States Patent Office 2,890,417
Patented June 9, 1959

2,890,417

FREQUENCY MODULATION SYSTEM

Milton Sanders, Stamford, Conn., assignor to the United States of America as represented by the Secretary of the Army Application May 27, 1957, Serial No. 661,980

3 Claims. (Cl. 332—16)

(Granted under Title 35, U.S. Code (1952), sec. 266)

The invention described herein may be manufactured and used by or for the Government for governmental purposes without the payment of any royalty thereon.

This invention relates to reactance tube frequency modulation systems in general and more particularly to a system where the reactance tube comprises a distributed line amplifier of the transmission type. The distributed line amplifier is fed with reactive current so that the components fed into the line toward an oscillator tank serving as load will cause frequency modulation as the bias of the line amplifier is varied changing its gain.

In the prior art, very wide band frequency deviation in a high frequency oscillator could not easily be obtained. The present invention provides a system which is capable of wider frequency deviations with lower amplitude modulation than systems used in the prior art. The invention has the further advantage that this wide band frequency modulation is obtained at high power levels in the oscillator and is not limited to low frequency modulation.

One object of the invention is to provide a frequency modulation system at high frequencies having very wide band frequency deviation.

A second object is to provide a frequency modulation system at high frequencies having very wide band frequency deviation with low amplitude modulation.

Another object is to provide a frequency modulation system at high frequencies having very wide band frequency deviation with low amplitude modulation which can be obtained at high power levels, and which is not limited to low frequency modulation.

The specific nature of the invention, as well as other subjects, uses, and advantages thereof, will clearly appear from the following description and from the accompanying drawing, in which.

Figure 1:
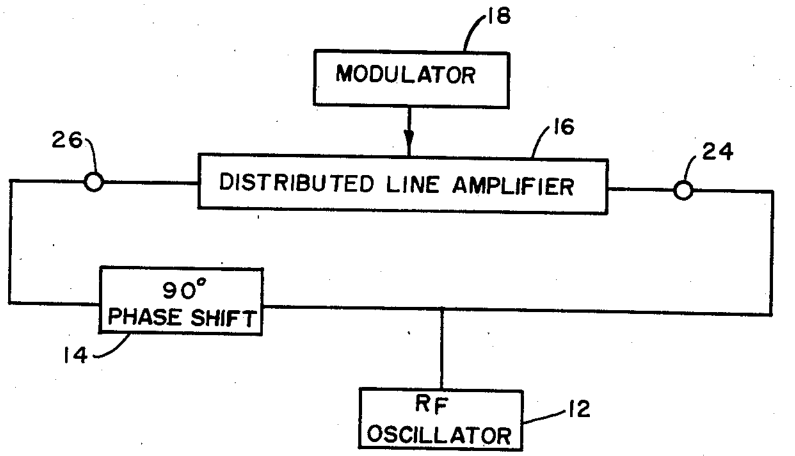
Figure 1 is a block diagram of a basic frequency modulation system in accordance with the invention.

Figure 1 shows a reactance tube frequency modulation system wherein a distributed line amplifier 16 is substituted for the reactance tube. The voltage of a radio frequency oscillator 12 is delivered to the input 26 of the distributed line amplifier 16 through a 90 degree rotation phase shift network 14. The output 24 of the line amplifier 16, which will be reactive current, is fed to the oscillator 12, the tuned circuit of the oscillator 12 serving as the load of the distributed line amplifier 16. A modulator 18 varies the gain of the distributed line amplifier 16 thereby causing frequency modulation of the oscillator 12.

The system of Figure 1 operates as a reactance tube frequency modulation system well known to those skilled in the art. The maximum bandwidth, and hence the maximum speed of rise, that can be obtained with ordinary video amplifiers is limited by the fact that the voltage gain obtained from a single tube must exceed unity if the amplifier is to be useful. In the distributed line amplifier this restriction is removed by an expedient that enables a number of tubes to act in parallel in so far as plate currents are concerned while their capacitances do not add in parallel. Therefore, the use of the distributed line amplifier 16 in Figure 1 permits very wide band frequency deviation at high frequencies, and also at high power levels in the oscillator 12. Experiments have shown that comparatively low accompanying amplitude modulation is produced. Furthermore, because electronic means are used for modulation, the very wide band frequency deviation can be obtained at high modulation frequencies.

Figure 2:
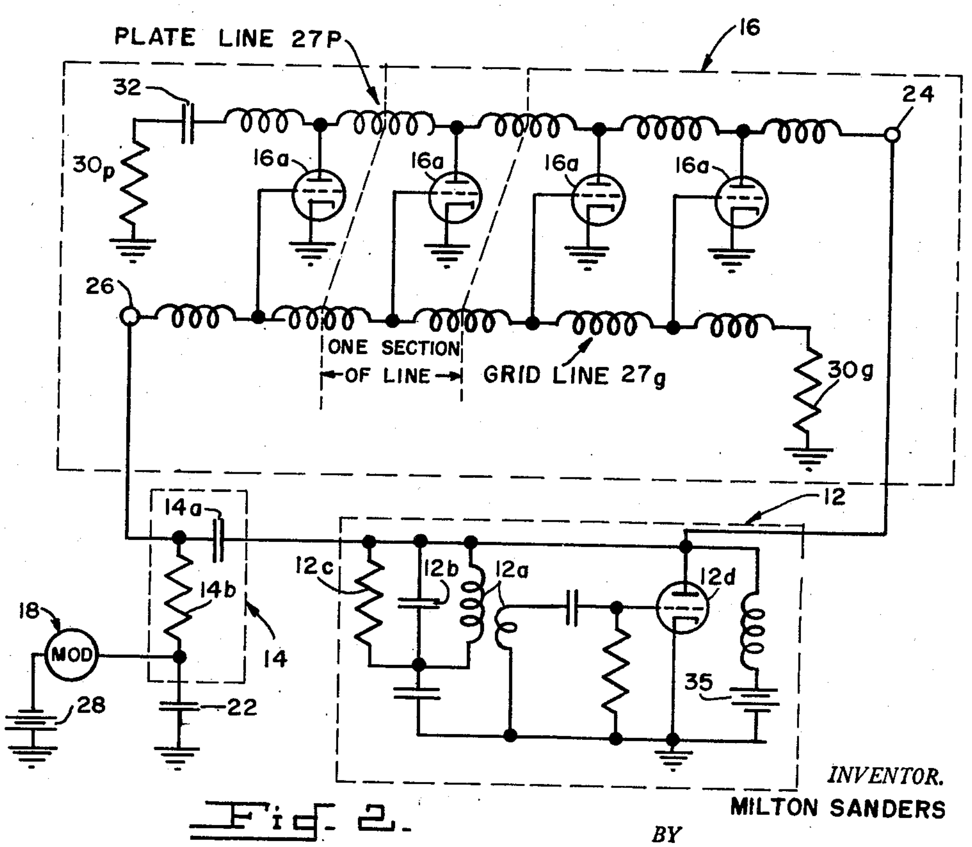
Figure 2 is a circuit diagram of an embodiment of Figure 1.

Figure 2 is a circuit diagram of one embodiment of Figure 1. The distributed line amplifier circuitry is shown in accordance with well known principles. The grids and plates of the electron tubes 16*a* are connected at regular intervals to lumped-constant artificial lines 27*g* and 27*p*, with the tube capacitances supplying the line capacitances. The grid and plate lines are so proportioned as to have the same phase shift between adjacent tubes, and characteristic impedance terminations comprising resistors 30*p* and 30*g* are provided at the ends of the plate and grid lines 27*p* and 27*g* respectively. Although four tubes 16*a* are shown any desired number of tubes may be utilized.

The oscillator tuned circuit comprising two inductively coupled inductors 12*a*, a capacitor 12*b*, and a loading resistor 12*c* serves as the load of the distributed line amplifier 16 and is connected to the plate line 27*p* at the output 24 of the line amplifier 16. The loading resistor 12*c* of the tuned circuit is adjusted to match the characteristic impedance of the plate line 27*p*.

The voltage across the tuned circuit is fed to a phase shift network 14 comprising a capacitor 14*a* and a resistor 14*b*. The capacitative reactance of the capacitor 14*a* is chosen more than ten times greater than the resistance of the resistor 14*b* causing the voltage appearing at the input 24 to the distributed line amplifier 16 to be 90 degrees out of phase with the voltage across the tuned circuit. The output impedance of the phase shift network 14 is adjusted to match the characteristic impedance of the grid line 27*g*. The modulating signal 18 in series with a bias voltage 28 controls the gain of the line amplifier 16 by controlling the bias applied to the grids of the tubes 16*a*. The value of the capacitor 22 is chosen so that it appears as a short at the oscillator frequency and as an open circuit at the modulation frequency.

A voltage supply source 35 supplies the direct current power to operate the line amplifier tubes 16*a* and the oscillator tube 12*d*. The capacitor 32 acts as a blocking capacitor.

The circuit of Figure 2 operates as a reactance tube frequency modulation system with the distributed line amplifier 16 substituted for the reactance tube of the prior art. The characteristics of very wide frequency deviation, low amplitude modulation, high power levels in the oscillator and high frequency modulation rates occur as discussed in connection with Figure 1, because of the advantages of the distributed line amplifier over conventional reactance tube circuits.

It will be apparent that the embodiments shown are only exemplary and that various modifications can be made in construction and arrangement within the scope of the invention as defined in the appended claims.

I claim:

1. A frequency modulation system comprising in combination: a radio frequency oscillator having a tuned circuit; a distributed line amplifier having said tuned circuit as load, the input of said distributed line amplifier being connected to a point 90 degrees out of phase with the voltage across said tuned circuit; and modulation means for varying the gain of said distributed line amplifier thereby varying the frequency of said oscillator.

2. A frequency modulation system comprising in combination: a radio frequency oscillator having a tuned circuit; a distributed line amplifier having said tuned circuit as load, said distributed amplifier being made up of electron tubes having their grids and plates connected at regular intervals to artificial lines, the grid and plate capacitances of said electron tubes supplying the line capacitances; a phase shift network having an input and an output, the voltage at said output being 90 degrees out of phase from the voltage at said input, said input being connected to said tuned circuit and said output being connected to the input of said distributed line amplifier; and a modulating signal connected so as to vary the bias on said tubes causing the gain of said distributed line amplifier to be varied thereby resulting in frequency modulation of said oscillator.

3. A frequency modulation system comprising in combination: a radio frequency oscillator having a tuned circuit comprising an inductor and capacitor in parallel; a phase shift network comprising a resistor and a capacitor in series, one end of said capacitor being connected to said tuned circuit and the other end of said resistor being connected to radio frequency ground, said capacitor being chosen so that its capacitative reactance is more than ten times greater than the resistance of said resistor; a distributed line amplifier having said tuned circuit as load, the input of said distributed amplifier being connected to the junction of said series resistor and capacitor, said distributed line amplifier being made up of electron tubes having their grids connected to a lumped-constant grid line and their plates connected to a lumped-constant plate line, the grid and plate capacitances of said tubes supplying the line capacitances of said grid and plate lines respectively; and a modulating signal source connected so as to vary the bias on said tubes causing the gain of said distributed line to be varied thereby resulting in frequency modulation of said oscillator.

References Cited in the file of this patent

UNITED STATES PATENTS

| | | |
|---|---|---|
| 2,363,918 | Wilcox et al. | Nov. 28, 1944 |
| 2,745,004 | Yu | May 8, 1956 |